United States Patent
Fan et al.

(10) Patent No.: US 7,642,608 B2
(45) Date of Patent: Jan. 5, 2010

(54) DUAL ISOLATION FOR IMAGE SENSORS

(75) Inventors: Xiaofeng Fan, Boise, ID (US); Richard A. Mauritzson, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 172 days.

(21) Appl. No.: 11/716,342

(22) Filed: Mar. 9, 2007

(65) Prior Publication Data
US 2008/0217720 A1    Sep. 11, 2008

(51) Int. Cl.
H01L 29/76  (2006.01)
H01L 29/94  (2006.01)
H01L 31/062 (2006.01)
H01L 31/113 (2006.01)
H01L 31/119 (2006.01)

(52) U.S. Cl. .................. 257/409; 257/59; 257/72
(58) Field of Classification Search ......... 257/59, 257/72, 360, 409
See application file for complete search history.

(56) References Cited

U.S. PATENT DOCUMENTS

| | | | |
|---|---|---|---|
| 5,306,940 | A | 4/1994 | Yamazaki |
| 6,897,082 | B2 | 5/2005 | Rhodes et al. |
| 7,002,231 | B2 | 2/2006 | Rhodes et al. |
| 7,009,227 | B2 | 3/2006 | Patrick et al. |
| 7,071,505 | B2 | 7/2006 | Rhodes |
| 7,091,059 | B2 | 8/2006 | Rhodes |
| 7,091,536 | B2 | 8/2006 | Rhodes et al. |
| 7,102,180 | B2 | 9/2006 | Rhodes et al. |
| 7,179,717 | B2 * | 2/2007 | Sandhu et al. .......... 438/424 |
| 2001/0017367 | A1 | 8/2001 | Rotstein |
| 2005/0012158 | A1 | 1/2005 | Gonzalez et al. |
| 2005/0127462 | A1 | 6/2005 | Rim et al. |
| 2005/0133825 | A1 | 6/2005 | Rhodes et al. |
| 2006/0054945 | A1 | 3/2006 | Mouli |
| 2006/0125035 | A1 | 6/2006 | Yaung |
| 2006/0131507 | A1 * | 6/2006 | Rahn .............. 250/370.09 |
| 2006/0145205 | A1 | 7/2006 | Kim |
| 2006/0148110 | A1 | 7/2006 | Sung |

(Continued)

FOREIGN PATENT DOCUMENTS

JP    2005217085    8/2005

OTHER PUBLICATIONS

International Search Report dated Jul. 7, 2008, for International Application No. PCT/US2008/056048 (5 pages).

*Primary Examiner*—Phuc T Dang
(74) *Attorney, Agent, or Firm*—Treyz Law Group; G. Victor Treyz

(57) ABSTRACT

Methods, methods of making, devices, and systems for image sensors that include isolation regions are disclosed. A semiconductor imager includes a pixel array and peripheral circuitry arranged on at least one side of the pixel array. Array devices are formed as part of the pixel array and periphery devices are formed in the periphery. Array isolation regions are disposed around at least a portion of at least some of the array devices and periphery isolation regions are disposed around at least a portion of at least some of the periphery devices. Within the semiconductor imager, the periphery isolation regions are configured differently from the array isolation regions. The semiconductor image sensor may be included in as part of an imaging system that includes a processor.

20 Claims, 8 Drawing Sheets

U.S. PATENT DOCUMENTS

2006/0197169 A1 9/2006 Cole
2006/0214201 A1 9/2006 Rhodes
2007/0075338 A1* 4/2007 Park et al. .................. 257/222

* cited by examiner

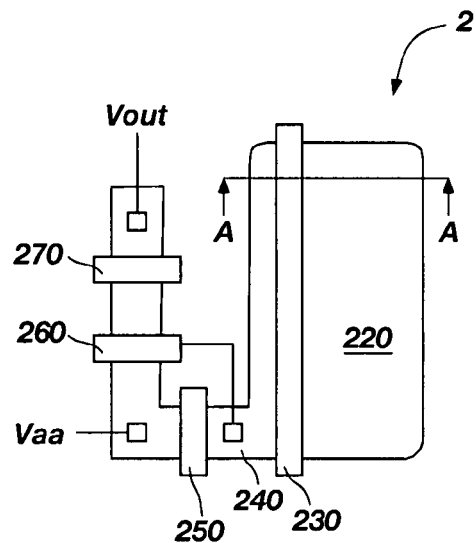
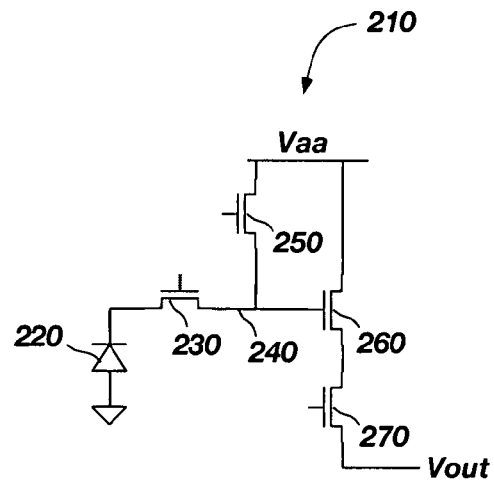
FIG. 3A
FIG. 3B
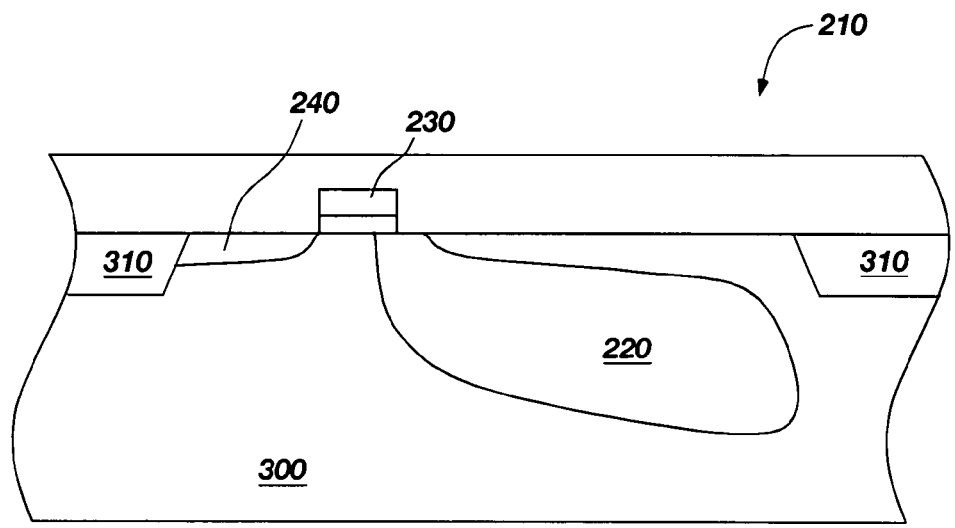
FIG. 3C

DUAL ISOLATION FOR IMAGE SENSORS

FIELD OF THE INVENTION

Embodiments of the present invention relate to semiconductor devices. More particularly, embodiments of the present invention relate to complementary metal oxide semiconductor (CMOS) image sensors.

BACKGROUND OF THE INVENTION

Many systems include imaging devices to sense and capture optical images that can be electronically converted to a digital representation of the image. These image sensors include an array of photo-sensitive devices such as photodiodes, photo-transistors, photoconductors, or photogates, fabricated on, for example, a complementary metal oxide semiconductor (CMOS) device. The photo-sensitive devices are arranged as an array of pixel cells in a focal plane. Each photo-sensitive device is sensitive to light in such a way that it can create an electrical charge that is proportional to the intensity of light striking the photo-sensitive device. The overall image captured by an image sensor includes many pixels arranged in an array such that each pixel detects the light intensity at the location of that pixel. A single pixel may include a single photo-sensitive device configured for detecting a broad frequency range, which may be used for gray scale images. In addition, a pixel may be defined as a single photosensitive device configured for detecting a specific color (i.e., frequency). Finally, a pixel may be defined as a group of photo-sensitive devices arranged near each other wherein different devices within the group are configured for detecting different colors. Thus, a full color image may be detected with the proper combination of color sensing pixels.

Many conventional CMOS imagers include isolation regions around devices in the pixel array and isolation regions around devices in a periphery region outside of the pixel array. These isolation regions may assist in preventing leakage current between the various devices. Particularly with imagers, it is important to reduce leakage currents that may adversely affect the charge collected on photodiodes. This leakage current to photodiodes may manifest as dark-current or as a coupling between adjacent pixels.

Isolation regions may be formed in different ways. For example, shallow trench isolation (STI) regions have been used, doped regions have been used, and a Local Oxidation of Silicon (LOCOS) process has been used. Each of these isolation types may have benefits and disadvantages. For example, a common problem associated with the formation of STI regions is that, when ions are implanted in the substrate close to the bottom and edges or sidewalls of the trench, current leakage can occur at the junction between the active device regions and the trench resulting in "hot pixels," (i.e., pixels that may appear brighter than other pixels). Minimizing hot pixels and dark current in a photodiode is important in CMOS image sensor fabrication. However, isolation between pixels and various devices in the pixel array is also important. As a result, in many cases, isolation regions are a trade off between hot pixel effects and coupling between adjacent devices. Furthermore, a type of isolation that is advantageous for pixel array devices may not be as advantageous for devices in the periphery logic.

There is a need for image sensors with isolation regions in the pixel array that differ from isolation regions in the periphery around the pixel array.

BRIEF DESCRIPTION OF THE DRAWINGS

In the drawings, which illustrate embodiments for carrying out the invention:

FIG. 3A is a top plan view illustrating an example layout of a single pixel sensor in accordance with an embodiment of the invention;

FIG. 3B is a circuit diagram of the pixel sensor of FIG. 3A;

FIG. 3C is a cross-sectional view of the pixel sensor of FIG. 3A along section line A-A;

DETAILED DESCRIPTION OF THE INVENTION

Figure 1:
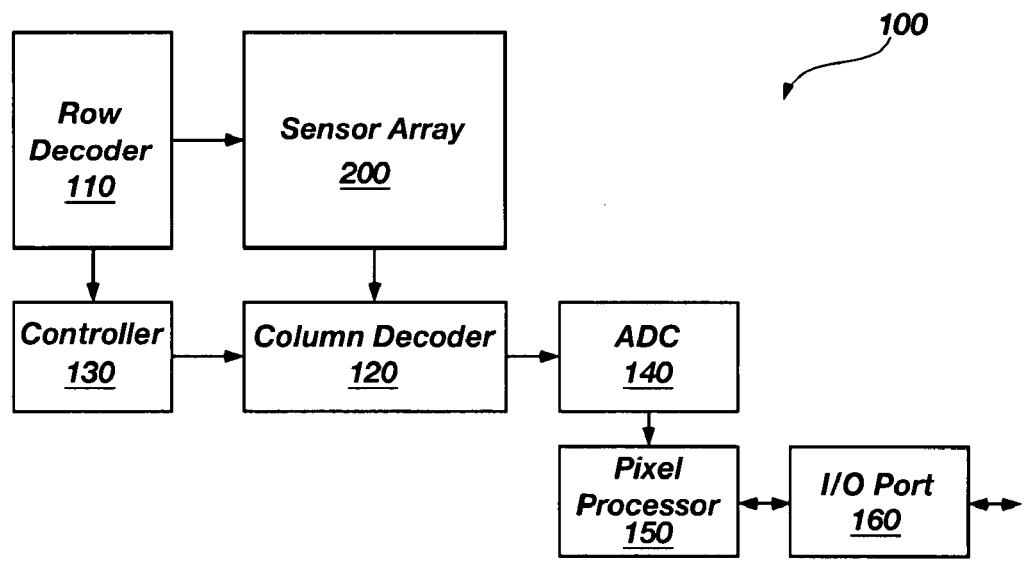
FIG. 1 is a simplified block diagram of a CMOS image sensor in accordance with a representative embodiment of the invention.

Embodiments of the present invention comprise methods, devices, and systems for image sensors that include isolation regions in the pixel array that differ from isolation regions in the periphery around the pixel array.

An embodiment of the present invention comprises a semiconductor imager that includes a sensor array and peripheral circuitry arranged on at least one side of the sensor array. The sensor array includes a plurality of pixels arranged in rows and columns and each pixel includes one or more array isolation regions configured to substantially isolate a first array-circuit-element from a second array-circuit-element. The peripheral circuitry includes one or more periphery isolation regions configured to isolate a first peripheral-circuit-element from a second peripheral-circuit-element. Within the semiconductor imager, the periphery isolation regions are configured differently from the array isolation regions.

Another embodiment of the present invention comprises a method of isolating circuit elements in a semiconductor imager. The method includes isolating array devices that are formed as part of a pixel array and isolating periphery devices that are formed outside of the pixel array. Isolation of the array devices is performed with array isolation regions disposed around at least a portion of at least some of the array devices. Isolation of the periphery devices is performed with periphery isolation regions disposed around at least a portion of at least some of the periphery devices. In addition, the array isolation regions are formed differently from the periphery isolation regions.

Another embodiment of the present invention comprises a method of forming a semiconductor imager. The method includes providing a semiconductor substrate. Array devices are formed on the semiconductor substrate in a pixel array region and periphery devices are formed on the semiconductor substrate in at least one periphery region bordering the pixel array region. The method also includes forming array isolation regions in the pixel array region and forming periphery isolation regions in the periphery regions. In addition, the periphery isolation regions differ in configuration from the array isolation regions.

Yet another embodiment, in accordance with the present invention, comprises an imaging system including a semiconductor imager and a memory operably coupled to the semiconductor imager. The memory is configured for storing a digital representation of an image captured by the semiconductor imager. The semiconductor imager includes a sensor array and peripheral circuitry arranged on at least one side of the sensor array. The sensor array includes a plurality of pixels arranged in rows and columns and each pixel includes one or more array isolation regions configured to substantially isolate a first array-circuit-element from a second array-circuit-element. The peripheral circuitry includes one or more periphery isolation regions configured to isolate a first peripheral-circuit-element from a second peripheral-circuit-element. Within the semiconductor imager, the periphery isolation regions are configured differently from the array isolation regions.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

In this description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

FIG. 1 is a simplified block diagram of a semiconductor imager 100 in accordance with an embodiment of the invention. The imager includes a sensor array 200, a row decoder 110, a column decoder 120, and a controller 130. The sensor array 200 (which may also be referred to as an array of pixels) includes photo-sensitive devices such as photodiodes, phototransistors, photoconductors, and photogates fabricated on, for example, a complementary metal oxide semiconductor (CMOS) device. Each photo-sensitive device is sensitive to light in such a way that it can create an electrical charge that is proportional to the intensity of light striking the photo-sensitive device. The overall image captured by the sensor array 200 includes many pixels arranged in an array such that each pixel detects the light intensity at the location of that pixel.

As stated earlier, a single pixel may include a single photo-sensitive device configured for detecting a broad frequency range, which may be used for gray scale images. In addition, a pixel may be defined as a single photo-sensitive device configured for detecting a specific color (i.e., frequency). Finally, a pixel may be a group of photo-sensitive devices arranged near each other wherein different devices within the group are configured for detecting different colors. Thus, a full color image may be detected with an appropriate combination of color sensing pixels. The term pixel as used herein may refer to a single photo-sensitive device for detecting a broad range of frequencies, a single photo-sensitive device for detecting a narrow frequency band, or a combination of photo-sensitive devices configured to capture a color image at the location of the pixel. The pixels of the sensor array 100 are arranged in individually addressable rows and columns such that the row decoder 110 can address each row of the sensor array 200 and the column decoder 120 can address each column of the sensor array 200. While not illustrated with connections, it will be understood by those of ordinary skill in the art that the controller 130 may control functions of many or all of the other blocks within the image sensor. For example, the controller 130 may control the exposure of the sensor array 200 (i.e., capturing an image) and the sequencing of the row decoder 110 and column decoder 120 to read out the analog values at each pixel location within the sensor array 200.

While not limited to a certain sequence, generally, the row decoder 110 selects a specific row and the column decoder 120 then receives every pixel in the selected row in parallel. The column decoder 120 can then sequence through each pixel within the selected row to determine the charge on each pixel.

As the pixels are each individually addressed, the resulting analog signal from each pixel may be sequentially directed from the column decoder 120 to an analog to digital converter 140. The analog to digital converter 140 converts the analog signal for each pixel to a digital signal representing the intensity of light at that pixel.

The digital signal for each pixel may be directed through a pixel processor 150. The pixel processor 150 may perform a number of functions on the pixel being processed. By way of example, and not limitation, if a pixel is identified as including an anomaly or defect, the value for the pixel may be replaced with a new value. For example, the value may be replaced by the value of a neighboring pixel or an average value from a number of neighboring pixels. In addition, other signal processing functions, such as, for example, filtering and compression may be performed by the pixel processor 150.

After processing, the current pixel may be transferred to an input/output (I/O) port 160 for transmission out of the semiconductor imager 100. The I/O port 160 may include storage to save up values from a number of pixels such that pixel values may be transferred out of the semiconductor imager 100 in a parallel or serial fashion.

Figure 2:
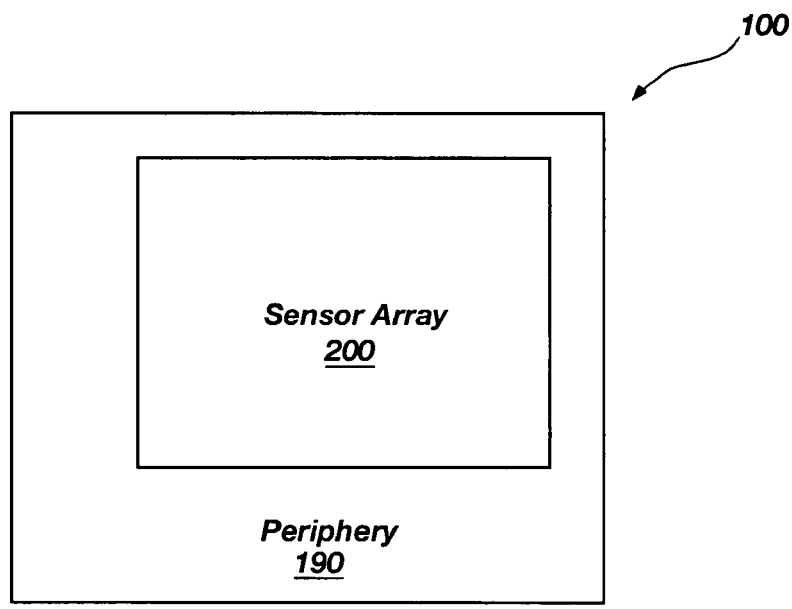
FIG. 2 is a top plan view illustrating an example of a possible layout of a sensor array and peripheral circuitry in accordance with an embodiment of the invention.

FIG. 2 is a top plan view illustrating an example of a possible layout of a semiconductor imager 100 including a sensor array 200 and periphery region 190 in accordance with an embodiment of the invention. The sensor array 200 includes the area of the semiconductor imager 100 where the pixels are formed and may be referred to herein as a pixel array region 200. Bordering the pixel array region 200 is the periphery region 190. The periphery region 190 may include peripheral circuitry, such as, for example, row decoders, column decoders, analog signal processing circuitry, analog to digital converters, input/output circuitry, and input/output pads. The configuration illustrated in FIG. 2 is simplified and shown as an example layout. Furthermore, while FIG. 2 illustrates periphery regions 190 on all sides of the pixel array region 200, those of ordinary skill in the art will recognize that the periphery regions 190 may be present on one or more sides of the pixel array region 200.

A brief discussion of a possible pixel configuration is included to give a basic understanding of the types of devices that may be present in the pixel array region 200 and how they may be isolated. FIGS. 3A-3C illustrate various views of an example implementation of a pixel 210 using a photodiode 220 and a 4-transistor control structure for the pixel 210. Those of ordinary skill in the art will recognize that the present invention may be practiced with a wide variety of pixel structures other than the one illustrated in FIGS. 3A-3C and may include devices not shown, such as, for example, resistors, capacitors, photoconductors, phototransistors and photogates. FIG. 3A is a top plan view illustrating an example layout of the pixel sensor 210 in accordance with an embodiment of the invention. FIG. 3B is a circuit diagram of the pixel sensor 210 of FIG. 3A. Finally, FIG. 3C is a cross-sectional view of the pixel sensor 210 of FIG. 3A along section line A-A. The pixel sensor 210 includes a photodiode 220, a transfer transistor 230, a floating diffusion region 240, a reset transistor 250, a source follower transistor 260, and a row select transistor 270.

In operation, the reset transistor 250 may be enabled to place the floating diffusion region 240 to a known potential, such as substantially near the potential of the Vaa voltage source. Either before or after initializing the floating diffusion region 240, the photodiode 220 may be exposed to light to convert photons to electrons in the photodiode region 220. The transfer transistor 230 is enabled to transfer the charge collected by the photodiode 220 onto the floating diffusion region 240. The floating diffusion region 240 is coupled to the gate of the source follower transistor 260 such that the charge on the floating diffusion region 240 is converted to a signal at the drain of the source follower transistor 260, wherein the signal is proportional to the charge on the floating diffusion region 240. The row select transistor 270 may be enabled to allow the signal at the drain of the source follower transistor 260 to be presented on the Vout signal.

The cross-section of FIG. 3C also illustrates isolation regions 310. The isolation region 310 on the right side of FIG. 3C assists in isolating the photodiode region 220 from any other devices in the pixel array. Similarly, the isolation region 310 on the left side of FIG. 3C assists in isolating the floating diffusion region 240 from other devices in the pixel array. Although not illustrated, those of ordinary skill in the art will recognize that the isolation regions may substantially surround the diffusion regions of the photodiode and diffusion regions of other devices in the pixel array.

Figure 4:
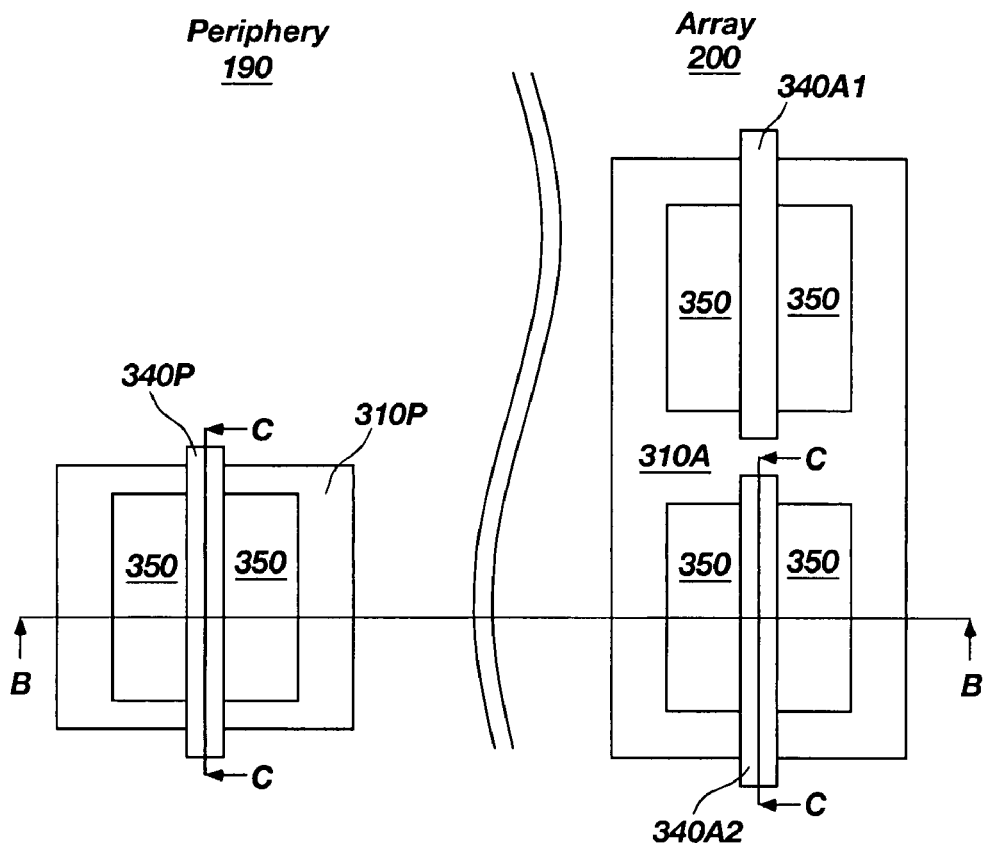
FIG. 4 is a top plan view illustrating example layouts of transistors in accordance with an embodiment of the invention.
Figure 5:
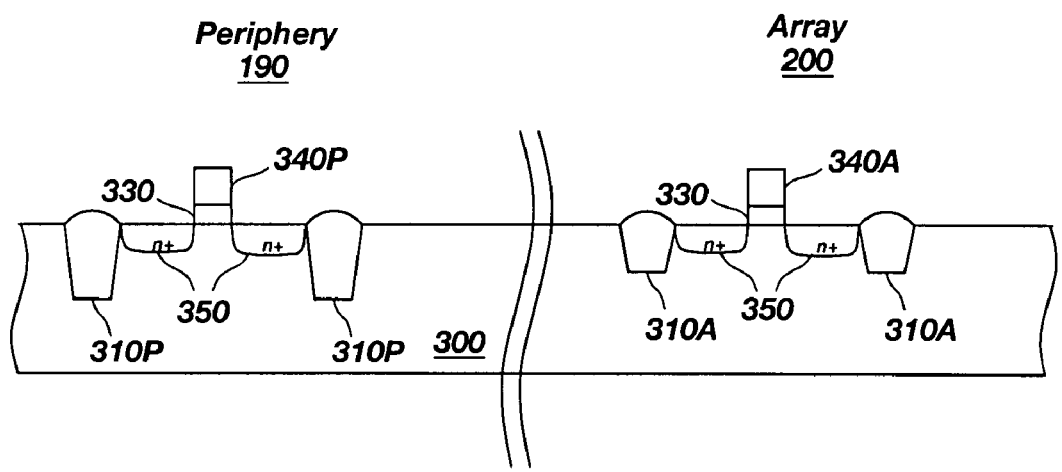
FIG. 5 is a cross-sectional view of the layout of FIG. 4 along section line B-B.

FIGS. 4 and 5 illustrate isolation regions substantially surrounding devices, such as, for example, transistors in both the pixel array region 200 and the periphery region 190. For simplicity, most of the figures and discussion presented herein are directed to n-channel transistors on a p-type substrate. However, those of ordinary skill in the art will recognize the embodiments of the present invention may include isolation structures for other devices, such as, for example, p-channel transistors, resistors, capacitors, photoconductors, and photogates. With a p-type substrate, the p-channel devices may be formed in an n-well and the isolation structures discussed herein may be formed within the n-well rather than the p-type substrate. Also, an n-type substrate, with p-wells may be used as is known by those of ordinary skill in the art.

FIG. 4 is a top plan view illustrating example layouts of transistors in both the periphery region 190 and the pixel array region 200. Although FIGS. 4-9C illustrate only a portion of the substrate with a single device in the periphery region 190 and one or two devices in the pixel array region 200, those of ordinary skill in the art will recognize that these figures and their corresponding descriptions contemplate the substantially simultaneous formation of many devices and isolation structures at various locations in the periphery region 190 and pixel array region 200.

FIG. 5 is a cross-sectional view of the layout of FIG. 4 along section line B-B. As stated earlier, a type of isolation region that is advantageous for pixel array devices may not be as advantageous for devices in the periphery around the array. When discussing isolation regions 310, the element numbering follows a convention of appending an "A" to indicate that the isolation region 310 is in the array region 200, or a "P" to indicate the isolation region 310 is in the periphery region 190. Furthermore, the element number may include an additional indicator such as "S" to indicate an STI region type of isolation, an "L" to indicate a LOCOS type of isolation, or a "D" to indicate a diffusion type of isolation.

In FIGS. 4 and 5, a periphery transistor is formed by gate 340P crossing n-type diffusion regions 350 to form an n-channel transistor. This periphery transistor includes an isolation region 310P surrounding the diffusion regions 350. While illustrated as completely surrounding the diffusion regions, embodiments of the present invention may include isolation on only some sides of the transistor. FIGS. 4 and 5 also illustrate a top gate 340A1 crossing n-type diffusion regions 350 to form an n-channel transistor in the pixel array region 200 and a bottom gate 340A2 crossing n-type diffusion regions 350 to form another n-channel transistor in the pixel array region 200. These array transistors includes an isolation region 310A surrounding the diffusion regions 350. While illustrated as completely surrounding the diffusion regions, embodiments of the present invention may include isolation on only some sides of the transistors in the pixel array region 200.

As illustrated in FIG. 5, an insulating layer 330 for example, silicon oxide, be grown or deposited on the substrate 300. This insulating layer 330 serves as the gate oxide or dielectric layer for the subsequently formed transistors. Next, a layer of conductive material is deposited over the oxide layer 330. The conductive layer (340A and 340P) serves as the gate electrode for the transistors. The conductive layer may be a layer of doped polysilicon or other suitable material. A second insulating layer (not shown) may be deposited over the polysilicon layer (340A and 340P). The second insulating layer may be formed of, for example, an oxide ($SiO_2$), a nitride (silicon nitride), an oxynitride (silicon oxynitride), ON (oxide-nitride), NO (nitride-oxide), or ONO (oxide-nitride-oxide).

FIG. 5 illustrates isolation regions (310P and 310A) formed at certain depths within the substrate 300. An example of a need for isolation between devices may be illustrated in FIG. 4, by discussing the region between the top gate 340A1 of the top transistor in the pixel array region 200 and the bottom gate 340A2 of the bottom transistor in the pixel array region 200. Without isolation in this region, the area between these two transistors may behave somewhat like a transistor such that when one or both gates (340A1 and 340A2) are asserted and there is a potential voltage bias difference between the diffusion areas 350, an inversion layer causing a small amount of conduction may occur between the diffusion areas 350 of the top transistor and the bottom transistor. An isolation region between the diffusion areas 350 of these two transistors will help to eliminate the potential inversion layer and minimize this possible conduction or leakage.

As discussed earlier, different types of isolation may have different advantages and shortcomings. As a result, isolation that is advantageous for devices in the pixel array region 200 may not be as advantageous for devices in the periphery region 190. For example, a common issue associated with the formation of STI regions is that, when ions are implanted in the substrate close to the bottom and edges or sidewalls of the trench, current leakage can occur at the junction between the active device regions and the trench resulting in "hot pixels" (i.e., pixels that may appear brighter than other pixels). In addition, the dominant crystallographic planes along the bottom and sidewalls of the trench isolation regions have a higher silicon density than the adjacent silicon substrate and, therefore, create a high density of trap sites along the trench bottom and sidewalls. These trap sites are normally uncharged but may become charged when electrons and holes become trapped in the trap sites. As a result of these trap sites formed along the bottom and sidewalls of the trench isolation regions, current generation near and along the trench bottom and sidewalls may occur. Current generated from trap sites inside or near the photodiode depletion region may cause undesired dark current. Minimizing hot pixels and dark current in a photodiode is important in CMOS image sensor fabrication. However, isolation between pixels and various devices in the pixel array is also important. As a result, embodiments of the present invention may use STI regions of a certain depth in the pixel array region 200 and STI regions of a different depth in the periphery region 190.

As another example, LOCOS isolation or diffusion isolation may provide sufficient isolation between devices in the pixel array region 200, but may not be deep enough into the substrate to provide sufficient isolation in the periphery region 190 or may not allow small enough isolation regions (e.g., tight geometries) in the periphery region 190, adversely effecting packing density. Conversely, in some cases it may be more advantageous to include STI isolation in the pixel array region 200 with LOCOS isolation or diffusion isolation in the periphery region 190.

Figure 7A:
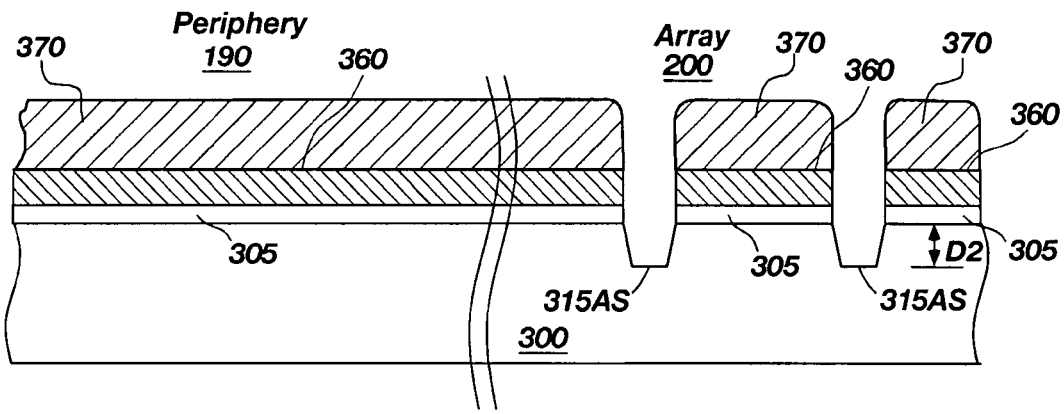
FIGS. 7A-7C are cross-sectional views illustrating process stages used in accordance with an embodiment of the invention.
Figure 7B:
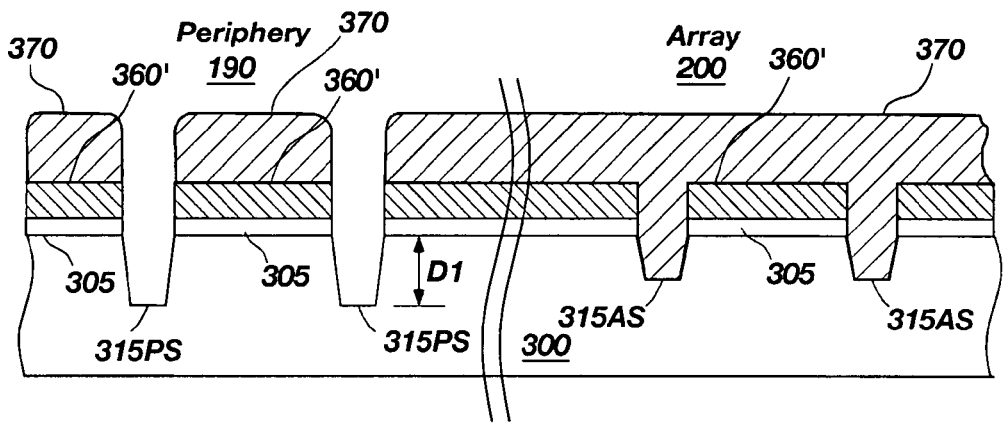

FIG. 7B illustrates the process for forming STI trenches in the periphery region 190. The nitride patterning layer 360' and barrier oxide layer 305 are again coated with resist, photo-patterned and etched to expose areas of the substrate where the periphery trenches are to be formed. Then, the trenches 315PS are etched to the first depth D1. After the periphery trenches 315PS are formed, photoresist 370 is removed by conventional techniques, such as wet or dry etching. Of course, the order of forming the array trenches 315AS first and the periphery trenches 315PS second may be reversed.

Therefore, embodiments of the present invention contemplate all combinations of isolation regions wherein the isolation regions 310P in the periphery region differ from the isolation regions 310A in the array region 200. For example these combinations may include STI regions of a first depth, STI regions of a second depth, LOCOS isolation regions, and diffusion isolation regions.

Figure 6A:
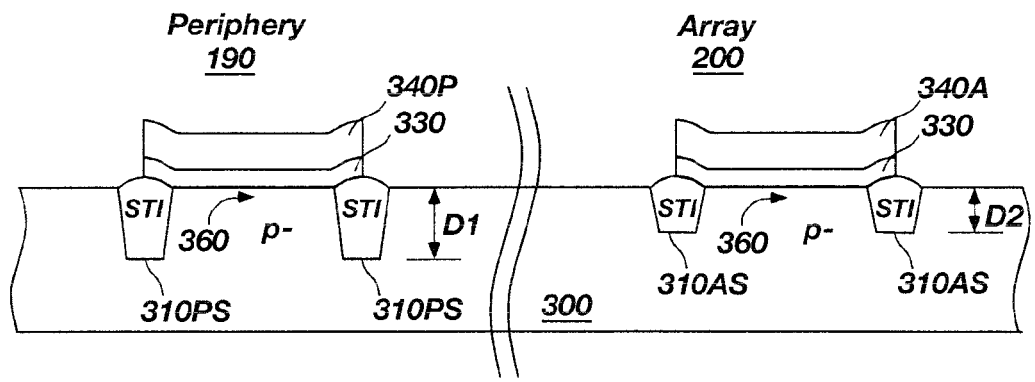
FIGS. 6A-6C are cross-sectional views of structures along section lines C-C of FIG. 4 that may be used in accordance with embodiments of the invention.
Figure 6B:
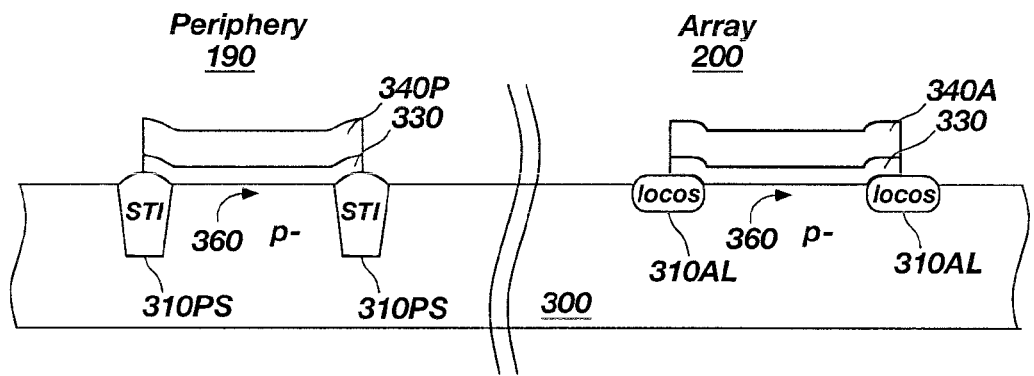
Figure 6C:
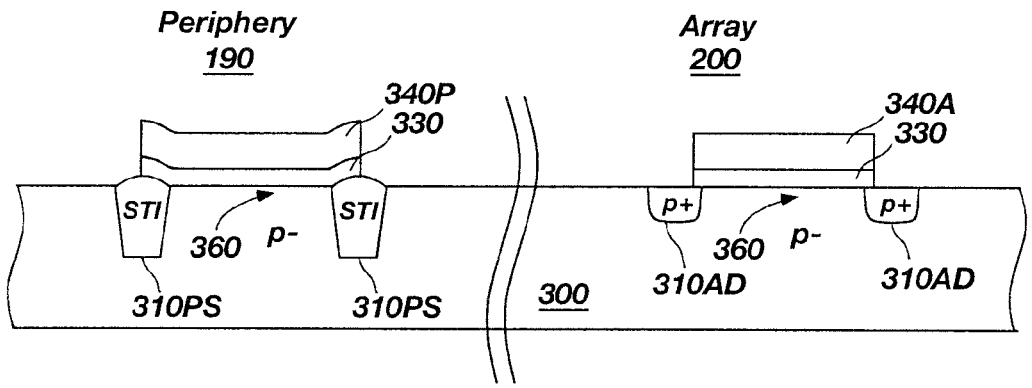

FIGS. 6A-6C are cross-sectional views of structures along section lines C-C of FIG. 4 that may be used in accordance with embodiments of the invention. FIG. 6A illustrates a periphery gate 340P over oxide 330 to form an n-channel region 360 in the periphery region 190. Bordering the n-channel region 360 are periphery isolation regions 310PS formed as STI regions of a first depth D1. In the array region 200, array gate 340A over oxide 330 forms an n-channel region 360. Bordering the n-channel region 360 are array isolation regions 310AS formed as STI regions of a second depth D2.

FIG. 6B illustrates a periphery gate 340P over oxide 350 to form an n-channel region 360 in the periphery region 190. Bordering the n-channel region 360 are periphery isolation regions 310PS formed as STI regions. In the array region 200, array gate 340A over oxide 350 forms an n-channel region 360. Bordering the n-channel region 360 are array isolation regions 310AL formed as LOCOS regions.

FIG. 6C illustrates a periphery gate 340P over oxide 330 to form an n-channel region 360 in the periphery region 190. Bordering the n-channel region 360 are periphery isolation regions 310PS formed as STI regions. In the array region 200, array gate 340A over oxide 330 forms an n-channel region 360. Bordering the n-channel region 360 are array isolation regions 310AD formed as diffusion regions of heavily doped p-type material. Of course, if the transistor was formed as a p-channel transistor in an N-well (or N-substrate), the isolation region 310AD would be formed as a diffusion region of heavily doped n-type material.

As stated earlier, other combinations of isolation regions may be used. Thus, while FIGS. 6A-6C illustrate only STI regions in the periphery, with different combinations in the array, combination with LOCOS regions or doped regions in the periphery are contemplated within the scope of the invention. These other combinations may be easily derived from the discussion herein by a person of ordinary skill in the art and need not be described in detail.

FIGS. 7A-9C are cross-sectional views illustrating process stages used for various embodiments of the invention. For simplicity, only process steps involved in forming the isolation regions are illustrated. Those of ordinary skill in the art will recognize other process steps involved in forming devices on the wafer may occur before, after, or in conjunction with the process steps involved in forming the isolation regions.

Figure 7C:
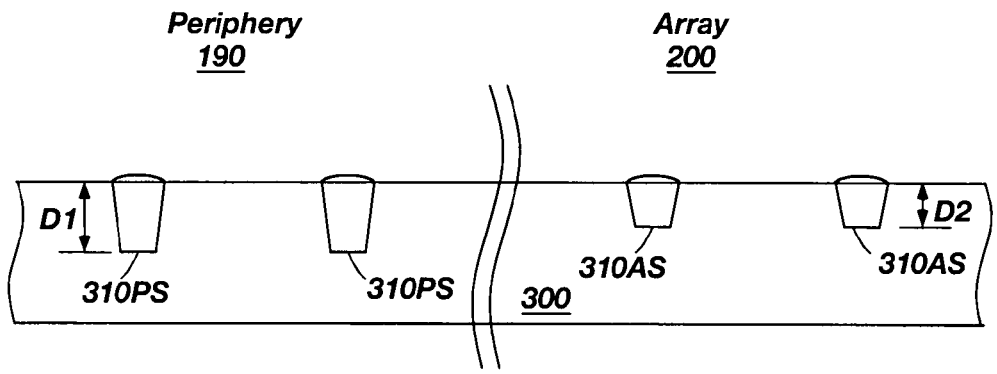

FIGS. 7A-7C are cross-sectional views illustrating process stages used in accordance with an embodiment of the invention that uses STI regions in the periphery region 190 and STI regions of a different depth in the array region 200. Trench isolation regions may be formed by etching trenches into the substrate 300 to provide a physical barrier between adjacent devices and to isolate devices optically and electrically from one another.

The example shown in FIGS. 7A-7C illustrate deeper trenches in the periphery region 190 than the trenches in the array region 200. By way of example, and not limitation, the periphery trenches 315PS may be about 3000 angstroms deep and the array trenches 315AS may be about 500-1500 angstroms deep. While not shown, embodiments of the present invention may have the deeper trenches in the array region 200 with shallower trenches in the periphery region 190.

FIG. 7A illustrates the process for forming STI trenches in the array region 200. The substrate 300 is covered with a barrier oxide layer 305 and a patterning layer 360. Typically, the barrier oxide may be a grown oxide. The patterning layer 360 may be a hard mask material, such as silicon nitride or silicon oxide material formed over the barrier oxide layer 305. Although, for simplicity, the process is described illustrating the patterning layer 360 formed over the barrier oxide layer 305, it should be understood that the barrier oxide layer 305 need not be present. The patterning layer 360 and barrier oxide layer 305 are coated with resist, photo-patterned, and etched to expose areas of the substrate where trenches are to be formed. Then, the trenches 315AS are etched to the second depth D2. The trenches may be etched by employing a dry anisotropic or other etching process. After the array trenches 315AS are formed, the photoresist 370 is stripped by conventional techniques, such as wet or dry etching.

As illustrated in FIG. 7C, with trenches formed in the periphery region 190 and the array region 200, the trenches may be filled with a dielectric, such as, for example, a silicon oxide such as SiO or $SiO_2$, a thermally grown oxide, oxynitride, a nitride material such as silicon nitride, silicon carbide, a high temperature polymer, or other suitable dielectric materials and combinations thereof. For example, the trench isolation region may include a thin layer of insulating material formed on the sidewalls and bottom of the trench. The thin insulating layer may be formed of a thermally grown oxide or of silicon nitride or an oxide/nitride combination for example, to aid in smoothing out the corners in the bottom of the trench and to reduce the amount of stress in the dielectric material used to later fill in the trenches. The remaining trench area may be filled with a silicon oxide or other suitable material with a process such as chemical vapor deposition (CVD). The filled trenches 315AS and 315PS are then planarized by an etch-back process, or Chemical-Mechanical Planarization (CMP) process for example, so that the dielectric remains only in the trenches and their top surface remains level with, or slightly above, that of the substrate 300. After the trenches (315AS, 315PS) are filled, the barrier oxide layer 305 and patterning nitride layer 360 are removed by conventional techniques, such as wet or dry etching. The result is periphery STI regions 310PS and array STI regions 310AS.

FIGS. 7A-7C illustrate the filing of the array trenches 315AS and periphery trenches 315PS at the same time. However, the two different types of trenches may be filled separately. In other words, the periphery trenches 315PS may be filled after they are patterned and etched and the array trenches 315AS may be filled after they are patterned and etched.

Figure 8A:
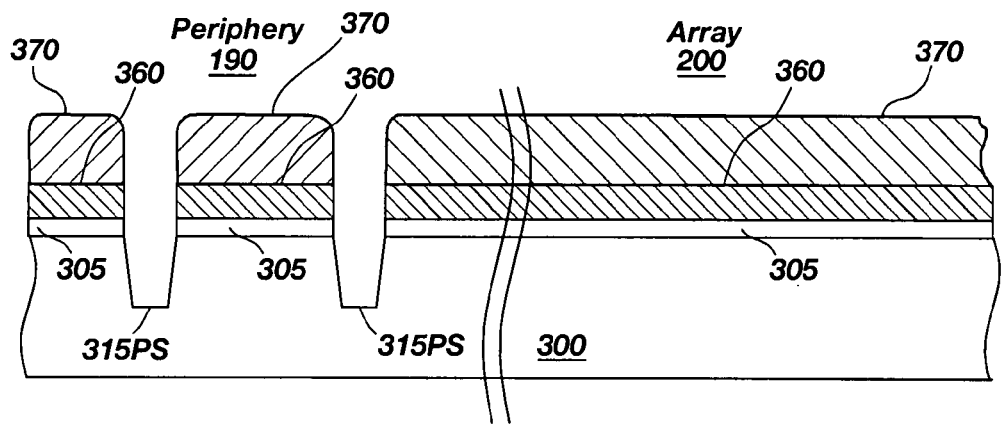
FIGS. 8A-8C are cross-sectional views illustrating process stages used in accordance with another embodiment of the invention.
Figure 8B:
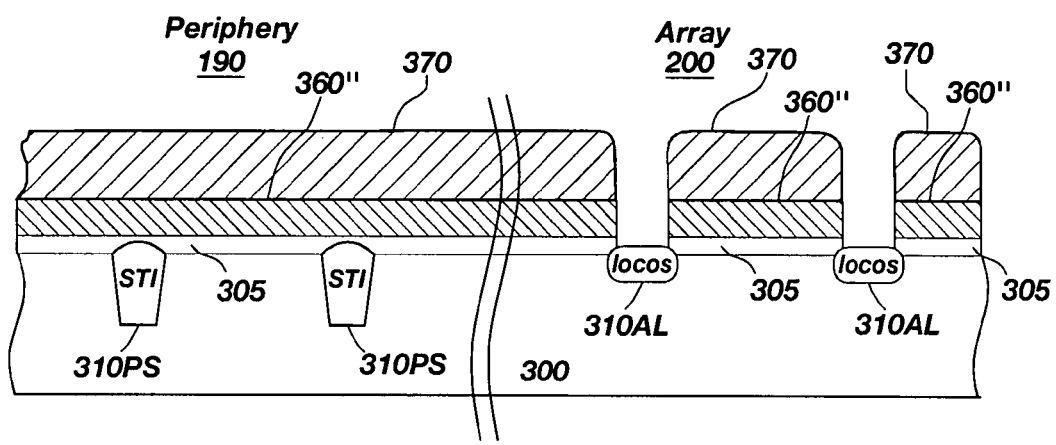
Figure 8C:
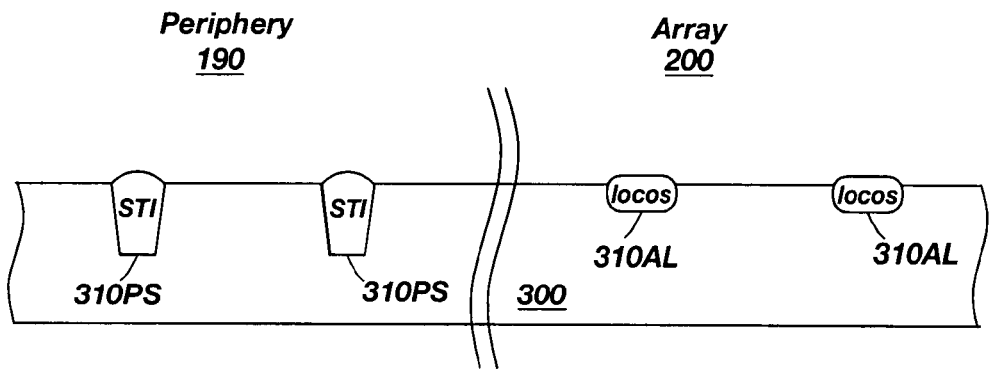

FIGS. 8A-8C are cross-sectional views illustrating process stages used in accordance with another embodiment of the invention that uses STI regions in the periphery region 190 and LOCOS regions in the array region 200.

FIG. 8A illustrates the process for forming STI trenches in the periphery region 190. The substrate 300 is covered with a barrier oxide layer 305 and a patterning layer 360. Typically, the barrier oxide may be a grown oxide. The patterning layer 360 may be a hard mask material, such as silicon nitride or silicon oxide material formed over the barrier oxide layer 305. Although, for simplicity, the process is described illustrating the patterning layer 360 formed over the barrier oxide layer 305, it should be understood that the barrier oxide layer 305 need not be present. The patterning layer 360 and barrier oxide layer 305 are coated with resist, photo-patterned and etched to expose areas of the substrate where trenches are to be formed. Then, the trenches 315PS are etched. The trenches may be etched by employing a dry anisotropic or other etching process. After the trenches 315PS are formed, the photoresist 370 is removed by conventional techniques, such as wet or dry etching. With trenches formed in the periphery region 190, the trenches may be filled with a dielectric and planarized as is explained above. Then, the barrier oxide layer 305 and nitride patterning layer 360 are removed by conventional techniques, such as wet or dry etching.

FIG. 8B illustrates the formation of LOCOS isolation regions in the array region 200. The substrate 300 is covered with a barrier oxide layer 305 and a second patterning layer 360". Typically, the barrier oxide may be a deposited oxide. The patterning layer 360" may be a hard mask material, such as silicon nitride or silicon oxide material formed over the barrier oxide layer 305. The patterning layer 360" and barrier oxide layer 305 are coated with resist, photo-patterned, and etched to expose areas of the substrate where LOCOS regions are to be formed. With the substrate exposed in selected regions, the photoresist 370 is removed by conventional techniques, and the LOCOS regions 310AL may be formed of thermally grown oxide in the exposed regions.

As illustrated in FIG. 8C, after the LOCOS regions 310AL are formed, the barrier oxide layer 305 and patterning layer 360" are removed by conventional techniques, such as wet or dry etching.

FIGS. 8A-8C illustrate the formation of the periphery STI structures 310PS first and the formation of the array LOCOS regions 310AL second. Of course, these steps may occur in the opposite order.

Figure 9A:
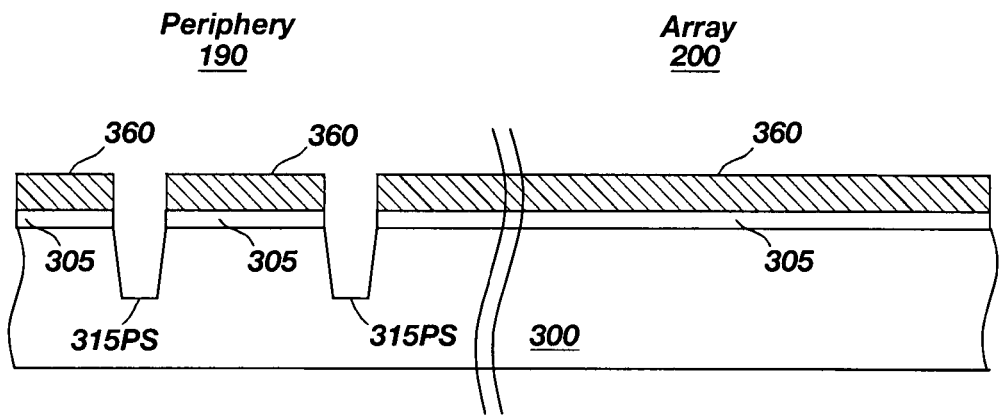
FIGS. 9A-9C are cross-sectional views illustrating process stages used in accordance with another embodiment of the invention.
Figure 9B:
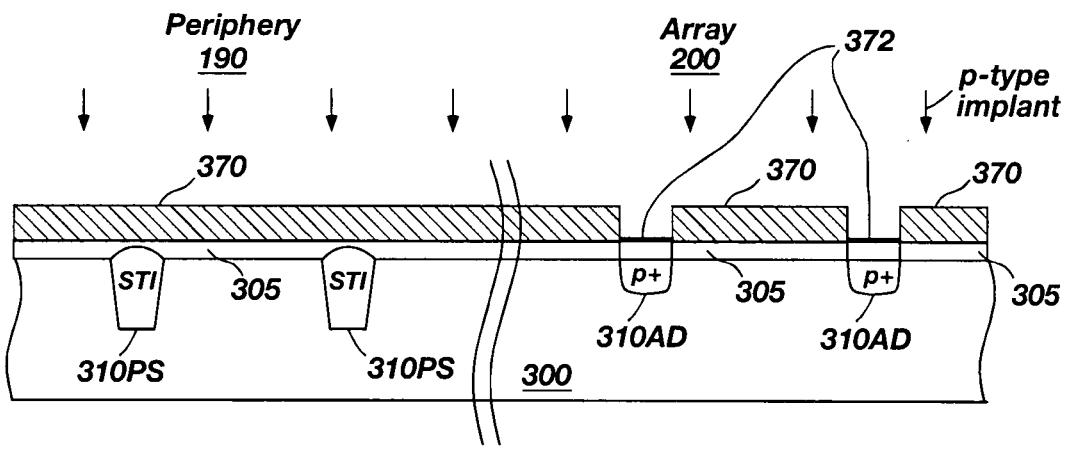
Figure 9C:
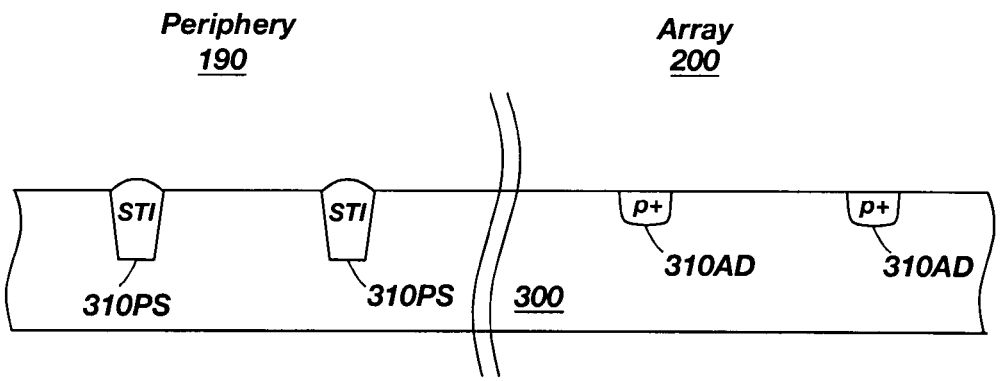

FIGS. 9A-9C are cross-sectional views illustrating process stages used in accordance with another embodiment of the invention that uses STI regions in the periphery region 190 and doped regions in the array region 200.

FIG. 9A illustrates the process for forming STI trenches in the periphery region 190. The substrate 300 is covered with a barrier oxide layer 305 and a patterning layer 360. Typically, the barrier oxide may be a grown oxide. The patterning layer 360 may be a hard mask material, such as silicon nitride or silicon oxide material formed over the barrier oxide layer 305. Although, for simplicity, the process is described illustrating the patterning layer 360 formed over the barrier oxide layer 305, it should be understood that the barrier oxide layer 305 need not be present. The patterning layer 360 and barrier oxide layer 305 are coated with resist, photo-patterned and etched to expose areas of the substrate where trenches are to be formed. Then, the trenches 315PS are etched. The trenches may be etched by employing a dry anisotropic or other etching process. After the trenches 315PS are formed, the photoresist 370 is removed by conventional techniques, such as wet or dry etching. With trenches formed in the periphery region 190, the trenches may be filled with a dielectric and planarized as is explained above. After the trenches 315PS are filled, the barrier oxide 305 and patterning nitride layer 360 may be removed by conventional techniques, such as wet or dry etching. Alternatively, some of the nitride layer 360, oxide layer 305, or combination thereof, may be maintained.

FIG. 9B illustrates the formation of doped regions 310AD in the array region 200. The substrate 300 is covered with a barrier oxide layer 305 and a patterning layer 370. Typically, the barrier oxide may be a deposited oxide. The patterning layer 370 may be a photoresist layer formed over the barrier oxide layer 305. As with the other embodiments, it should be understood that the barrier oxide layer 305 need not be present. The patterning layer 370 is developed and baked to expose areas of the substrate where doped regions are to be formed.

With the substrate exposed in selected regions, the doped regions 310AD may be formed by implantation of a p-type dopant through the open regions in the patterning layer 370. By way of example, and not limitation, the p-type dopant may be boron, beryllium, indium, or magnesium. As stated earlier, isolation regions may be formed around p-channel devices also. For the case of p-channel devices, the doped regions 310AD may be formed with n-type dopant. By way of example, and not limitation, the n-type dopant may be phosphorus, arsenic, or antimony As illustrated in FIG. 9C, after the doped regions 310AD are formed, the barrier oxide layer 305 and patterning layer 370 are removed by conventional techniques, such as wet or dry etching.

FIGS. 9A-9C illustrate the formation of the periphery STI structures 310PS first and the formation of the doped regions 310AD second. Of course, these steps may occur in the opposite order. Furthermore, those of ordinary skill in the art will recognize that the doped isolation regions 310AD may also be formed after poly gate deposition.

While only illustrated with one type of isolation in the periphery and another type of isolation in the array, those of ordinary skill in the art will understand that embodiments of the present invention may include more than one type of isolation in the periphery and more than one type of isolation in the array.

Figure 10:
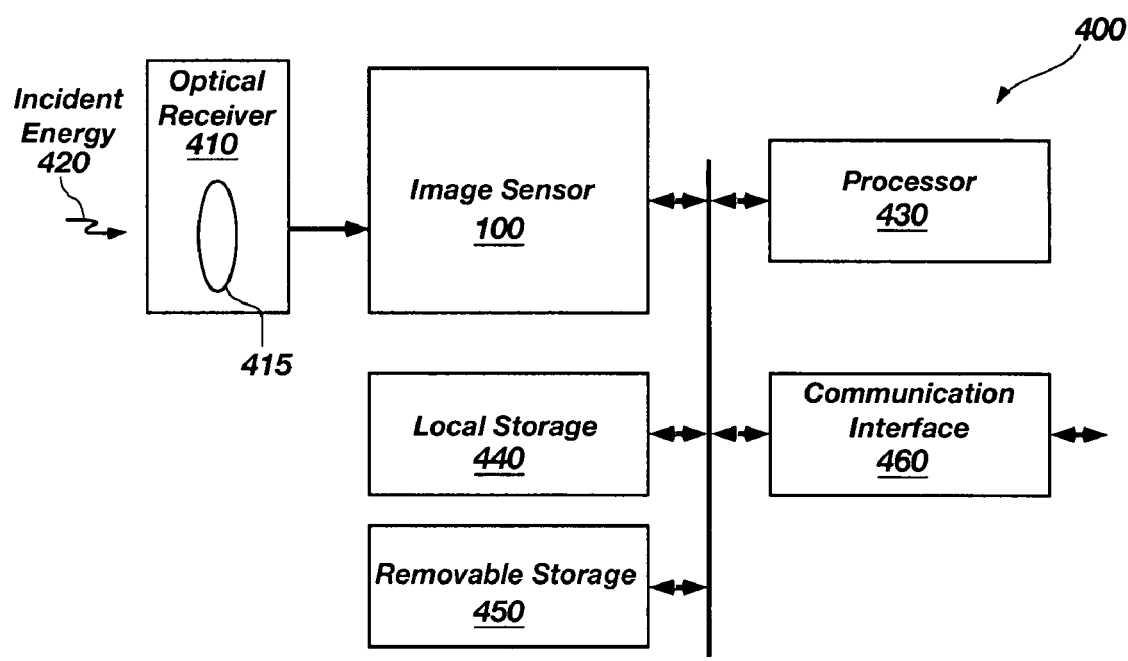
FIG. 10 is a simplified imaging system block diagram including an image sensor formed according to embodiments of the present invention.

FIG. 10 illustrates an imaging system 400 including a semiconductor imager 100 containing isolation devices according to the present invention. The imaging system 400 includes a processor 430 for receiving and modifying digital representations of images from the semiconductor imager 100. The imaging system 400 may also include an optical receiver 410 for channeling, focusing, or modifying incident energy 420, being visible light in one case, to present an optical image to the image sensor. For example, the optical receiver 410 may include a lens 415 for focusing the incident energy 420 onto the semiconductor imager 100.

The imaging system 400 may include a communication interface 460 for transmitting and receiving data and control information. Finally, the imaging system 400 may include memory (440 and 450) in the form of local storage 440 and removable storage 450, such as, for example, Flash memory, magnetic recording media and optical recording media.

Without being limiting, such an imaging system 400 may include systems such as a computer system, camera system, scanner, machine vision, videophone, surveillance system, auto focus system, image stabilization system, and data compression system.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A semiconductor imager, comprising:
a sensor array comprising a plurality of pixels arranged in rows and columns, each pixel of the plurality including at least one array isolation region configured to substantially isolate a first array-circuit-element from a second array-circuit-element; and
peripheral circuitry arranged on at least one side of the sensor array, the peripheral circuitry including at least one periphery isolation region configured to isolate a first peripheral-circuit-element from a second peripheral-circuit-element, wherein the at least one periphery isolation region differs in configuration from the at least one array isolation region.

2. The semiconductor imager of claim 1, wherein each of the first array-circuit-element and the second array-circuit-element are selected from the group consisting of a photodiode, a photoconductor, a photogate, a transistor, and a capacitor.

3. The semiconductor imager of claim 1, wherein the at least one periphery isolation region includes a shallow trench isolation structure.

4. The semiconductor imager of claim 3, wherein at least one additional periphery isolation region includes one or more structures selected from the group consisting of, a p-type doped region, an n-type doped region, and a LOCOS region.

5. The semiconductor imager of claim 3, wherein the at least one array isolation region includes one or more structures selected from the group consisting of a STI region with a depth different from the STI region of the at least one periphery isolation region, a p-type doped region, an n-type doped region, and a LOCOS region.

6. The semiconductor imager of claim 1, wherein the at least one periphery isolation region includes a LOCOS region.

7. The semiconductor imager of claim 6, wherein at least one additional periphery isolation region includes one or more structures selected from the group consisting of a p-type doped region, an n-type doped region, and a STI region.

8. The semiconductor imager of claim 6, wherein the at least one array isolation region includes one or more structures selected from the group consisting of a p-type doped region, an n-type doped region, and a STI region.

9. The semiconductor imager of claim 1, wherein the at least one periphery isolation region includes a doped region.

10. The semiconductor imager of claim 9, wherein at least one additional periphery isolation region includes one or more structures selected from the group consisting of a LOCOS region, and a STI region.

11. The semiconductor imager of claim 9, wherein the at least one array isolation region includes one or more structures selected from the group consisting of a LOCOS region, and a STI region.

12. The semiconductor imager of claim 9, wherein the doped region is selected from the group consisting of a p-type doped region and an n-type doped region.

13. An imaging system, comprising:
a semiconductor imager, comprising:
a sensor array comprising a plurality of pixels arranged in rows and columns, each pixel of the plurality including at least one array isolation region configured to substantially isolate a first array-circuit-element from a second array-circuit-element; and peripheral circuitry arranged on at least one side of the sensor array, the peripheral circuitry including at least one periphery isolation region configured to isolate a first peripheral-circuit-element from a second peripheral-circuit-element, wherein the at least one periphery isolation region differs in configuration from the at least one array isolation region; and a memory operably coupled to the semiconductor imager and configured for storing a digital representation of an image captured by the sensor array.

14. The imaging system of claim 13, further comprising an optical receiver configured to receive and modify incident light and present the modified light to the sensor array.

15. The imaging system of claim 13, further comprising:
a processor operably coupled to the semiconductor imager; and
a communication interface operably coupled to the processor and configured for communicating the digital representation to an external device.

16. A semiconductor imager, comprising:
a sensor array region of the semiconductor imager;
a periphery region of the semiconductor imager bordering at least one edge of the sensor array region;
a plurality of array isolation regions in the sensor array region, each array isolation region between at least two array-circuit-elements in the sensor array; and
a plurality of periphery isolation regions in the periphery region, each periphery isolation region between at least two peripheral transistors in the periphery region, wherein the plurality of periphery isolation regions differ in configuration from the plurality of array isolation regions.

17. The semiconductor imager of claim 16, wherein each of the at least two array-circuit-elements are selected from the group consisting of a photodiode, a photoconductor, a photogate, a transistor, and a capacitor.

18. The semiconductor imager of claim 16, wherein the plurality of array isolation regions comprise one or more structures selected from the group consisting of a STI region with a depth different from the STI region of the plurality of periphery isolation regions, a p-type doped region, an n-type doped region, and a LOCOS region.

19. The semiconductor imager of claim 16, wherein the plurality of periphery isolation regions comprise shallow trench isolation structures.

20. The semiconductor imager of claim 16, wherein at least one periphery isolation region of the plurality comprises a shallow trench isolation structure and at least one other periphery isolation region of the plurality includes one or more structures selected from the group consisting of a p-type doped region, an n-type doped region, and a LOCOS region.

* * * * *